(12) United States Patent
Wang et al.

(10) Patent No.: US 11,387,823 B2
(45) Date of Patent: Jul. 12, 2022

(54) PFM CONTROL CIRCUIT, PFM CONTROL SYSTEM AND PFM CONTROL METHOD

(71) Applicant: Realtek Semiconductor Corporation, Hsinchu (TW)

(72) Inventors: Shih-Cheng Wang, Taichung (TW); Chun-Yu Luo, Taoyuan (TW); Shih-Chieh Chen, Yilan (TW); Liang-Hui Li, Zhubei (TW); Chun-Fu Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 182 days.

(21) Appl. No.: 16/851,199

(22) Filed: Apr. 17, 2020

(65) Prior Publication Data
US 2021/0226538 A1    Jul. 22, 2021

(30) Foreign Application Priority Data
Jan. 16, 2020  (TW) .................... 109101586

(51) Int. Cl.
*H02M 7/06* (2006.01)
*H03K 7/06* (2006.01)
*H03H 19/00* (2006.01)
*H02M 1/00* (2006.01)
*H02M 3/158* (2006.01)

(52) U.S. Cl.
CPC ............ *H03K 7/06* (2013.01); *H02M 1/0032* (2021.05); *H02M 3/158* (2013.01); *H03H 19/004* (2013.01)

(58) Field of Classification Search
CPC .. H03K 7/06; H03K 5/24; H03K 7/04; H03K 19/20; H02M 1/0032; H02M 3/158; H02M 3/1588; H02M 1/0025; H03H 19/004; Y02B 70/10
See application file for complete search history.

(56) References Cited

U.S. PATENT DOCUMENTS

| | | | |
|---|---|---|---|
| 6,215,288 B1 * | 4/2001 | Ramsey | H02M 3/1588 323/224 |
| 7,173,404 B2 * | 2/2007 | Wu | H02M 3/156 323/283 |
| 7,385,379 B2 * | 6/2008 | Aioanei | H02M 3/1588 323/284 |

(Continued)

*Primary Examiner* — Kyle J Moody
(74) *Attorney, Agent, or Firm* — Locke Lord LLP; Tim Tingkang Xia, Esq.

(57) ABSTRACT

A PFM control circuit includes a switching circuit, a slope-decision circuit, a flip-flop, a first and a second comparison circuits. The first comparison circuit outputs a first signal according to an output voltage of a power conversion circuit. The switching circuit outputs a switching signal according to an output current of the power conversion circuit. The slope-decision circuit outputs a slope modulation voltage, and determines a slope modulation voltage with a first or a second slope according to the switching signal. The second comparison circuit outputs the second signal according to the slope modulation voltage. The flip-flop outputs a control signal to the power conversion circuit according to the first and the second signals. When the slope modulation voltage has the first or the second slope, the control signal has a first or a second frequency accordingly. The first frequency is higher than the second frequency.

20 Claims, 7 Drawing Sheets

(56) References Cited

U.S. PATENT DOCUMENTS

| | | | | |
|---|---|---|---|---|
| 8,941,367 B2* | 1/2015 | Li | ............................ | G05F 1/46 |
| | | | | 323/271 |
| 9,716,432 B2* | 7/2017 | Ouyang | ................ | H02M 3/158 |
| 2004/0257055 A1* | 12/2004 | Aioanei | .............. | H02M 3/1588 |
| | | | | 323/282 |
| 2012/0250367 A1 | 10/2012 | Desimone et al. | | |
| 2019/0013729 A1 | 1/2019 | Kim et al. | | |
| 2019/0081546 A1* | 3/2019 | Hsu | ....................... | H02M 3/158 |

\* cited by examiner

US 11,387,823 B2

PFM CONTROL CIRCUIT, PFM CONTROL SYSTEM AND PFM CONTROL METHOD

RELATED APPLICATIONS

The application claims priority to Taiwan Application Serial Number 109101586, filed Jan. 16, 2020, which is herein incorporated by reference.

BACKGROUND

Technical Field

The disclosure relates to a PFM control circuit, a PFM control system and a PFM control method thereof, particularly to the PFM control circuit, the PFM control system and the PFM control method for reducing noise.

Description of Related Art

With the development of science and technology, portable electronic devices with Audio Codec or Audio Amp circuits have been widely used in people's daily lives, such as wireless Bluetooth headsets and mobile phones.

When these devices operate in a power saving mode, the power supply circuit usually uses pulse frequency modulation (PFM) to reduce the overall power consumption so as to extend the standby time of the devices. And when the load of the audio circuit in the device is small and the power of the audio circuit in the device is low, noise spurs may enter the low frequency and cause discomfort to the human ear.

Therefore, how to reduce noise spurs is one of important issues in this field.

SUMMARY

One aspect of the present disclosure is a PFM control circuit. The PFM control circuit includes a first comparison circuit, a switching circuit, a slope decision circuit, a second comparison circuit and a flip-flop circuit. The first comparison circuit is configured to output a first signal according to an output voltage of a power conversion circuit. The switching circuit is configured to output a switching signal according to an output current of the power conversion circuit. The slope decision circuit is configured to output a slope modulation voltage, and to decide the slope modulation voltage with a first slope or a second slope according to the switching signal. The second comparison circuit is configured to output a second signal according to the slope modulation voltage. The flip-flop circuit is configured to output a control signal to the power conversion circuit according to the first signal and the second signal. When the slope modulation voltage has the first slope, the control signal has a first frequency. When the slope modulation voltage has the second slope, the control signal has a second frequency. The first frequency is higher than the second frequency.

Another aspect of the present disclosure is a PFM control system. The PFM control system includes a power conversion circuit and a PFM control circuit. The power conversion circuit is configured to generate an output signal according to a control signal to charge and to discharge to a load. The PFM control circuit includes a first comparison circuit, a switching circuit, a slope decision circuit, a second comparison circuit and a flip-flop circuit. The first comparison circuit is configured to output a first signal of an output voltage according to the output signal. The switching circuit is configured to output a switching signal according to an output current of the output signal. The slope decision circuit is configured to output a slope modulation voltage, and to decide the slope modulation voltage with a first slope or a second slope according to the switching signal. The second comparison circuit is configured to output a second signal according to the slope modulation voltage. The flip-flop circuit is configured to output the control signal to the power conversion circuit according to the first signal and the second signal.

Another aspect of the present disclosure is a PFM control method. The PFM control method includes: outputting, by a PFM control circuit, a control signal; charging and discharging, by a power conversion circuit, to a load according to the control signal, so as to generate an output signal; determining whether the load connected to the power conversion circuit is at a light loading according to the output signal, and determining whether the frequency of the control signal is lower than the frequency of a low frequency signal; switching a capacitance array of the PFM control circuit into a first capacitance value when the load is at the light loading and the frequency of the control signal is lower than the frequency of the low frequency signal, so as to generate the control signal with a first frequency; and switching the capacitance array of the PFM control circuit into a second capacitance value when the load is not at the light loading or the frequency of the control signal is not lower than the frequency of the low frequency signal, so as to generate the control signal with a second frequency, wherein the first capacitance value is smaller than the second capacitance value, the first frequency is higher than the second frequency.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

Figure 1:
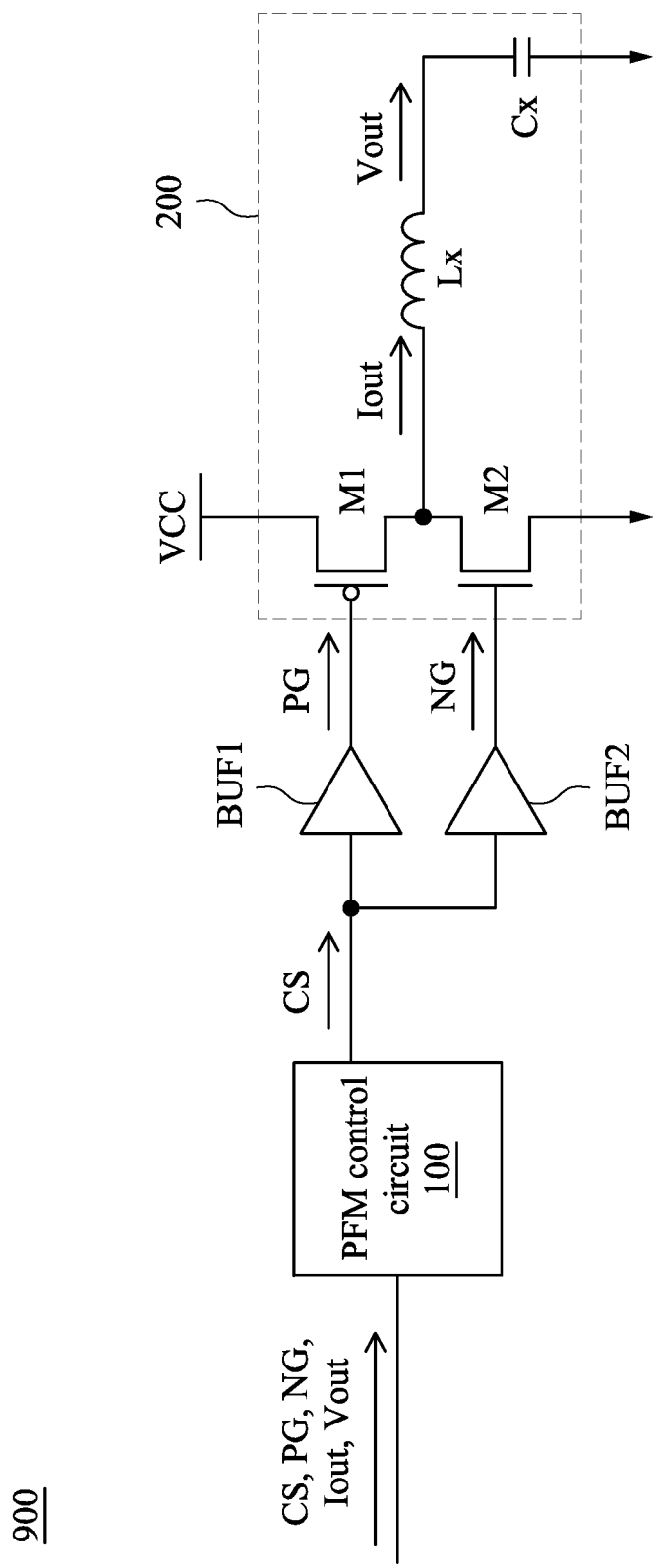
FIG. 1 is a schematic diagram illustrating a PFM control system in accordance with some embodiments of the disclosure.

Please refer to FIG. 1. FIG. 1 is a schematic diagram illustrating a PFM control system 900 in accordance with some embodiments of the disclosure. As shown in FIG. 1, the PFM control system 900 includes a PFM control circuit 100, buffer circuits BUF1 and BUF2, and a power conversion circuit 200. The PFM control circuit 100 is connected to the power conversion circuit 200 through the buffer circuits BUF1 and BUF2. Specifically, the PFM control circuit 100 outputs a control signal CS to the buffer circuits BUF1 and BUF2. The buffer circuits BUF1 and BUF2 generate delay signals PG and NG to the power conversion circuit 200 respectively according to the control signal CS.

In some embodiments, the power conversion circuit 200 may be realized by a Buck Converter. As shown in FIG. 1, the power conversion circuit 200 includes an inductance Lx, a capacitance Cx, switches M1 and M2. Specifically, a first terminal of the switch M1 is connected to a system high voltage VCC. A control terminal of the switch M1 receives the delay signal PG. A second terminal of the switch M1 and a first terminal of the switch M2 are connected to a first terminal of the inductance Lx. A control terminal of the switch M2 receives the delay signal NG. A second terminal of the switch M2 is connected to the ground. A second terminal of the inductance Lx is connected to a first terminal of the capacitance Cx. A second terminal of the capacitance Cx is connected to the ground.

operationally, when the control signal CS is at a low level, the delay signals PG and NG are also at the low level, so that the switch M1 turns on and the switch M2 turns off, so as to provide the system high voltage VCC to charge the inductance Lx, the capacitance Cx and a back-end load (not shown in figure). And when the control signal CS is at a high level, the delay signals PG and NG are also at the high level, so that the switch M1 turns off and the switch M2 turns on, so as to discharge the inductance Lx, the capacitance Cx and the back-end load.

In this way, with the level of the control signal CS, the power conversion circuit 200 is able to charge or discharge the load, so as to generate an output signal (i.e., an output current Iout and an output voltage Vout shown in FIG. 1). In addition, the PFM control circuit 100 receives the control signal CS, the delay signals PG and NG, the output current Iout and the output voltage Vout and performs feedback control according to these signals.

Figure 2:
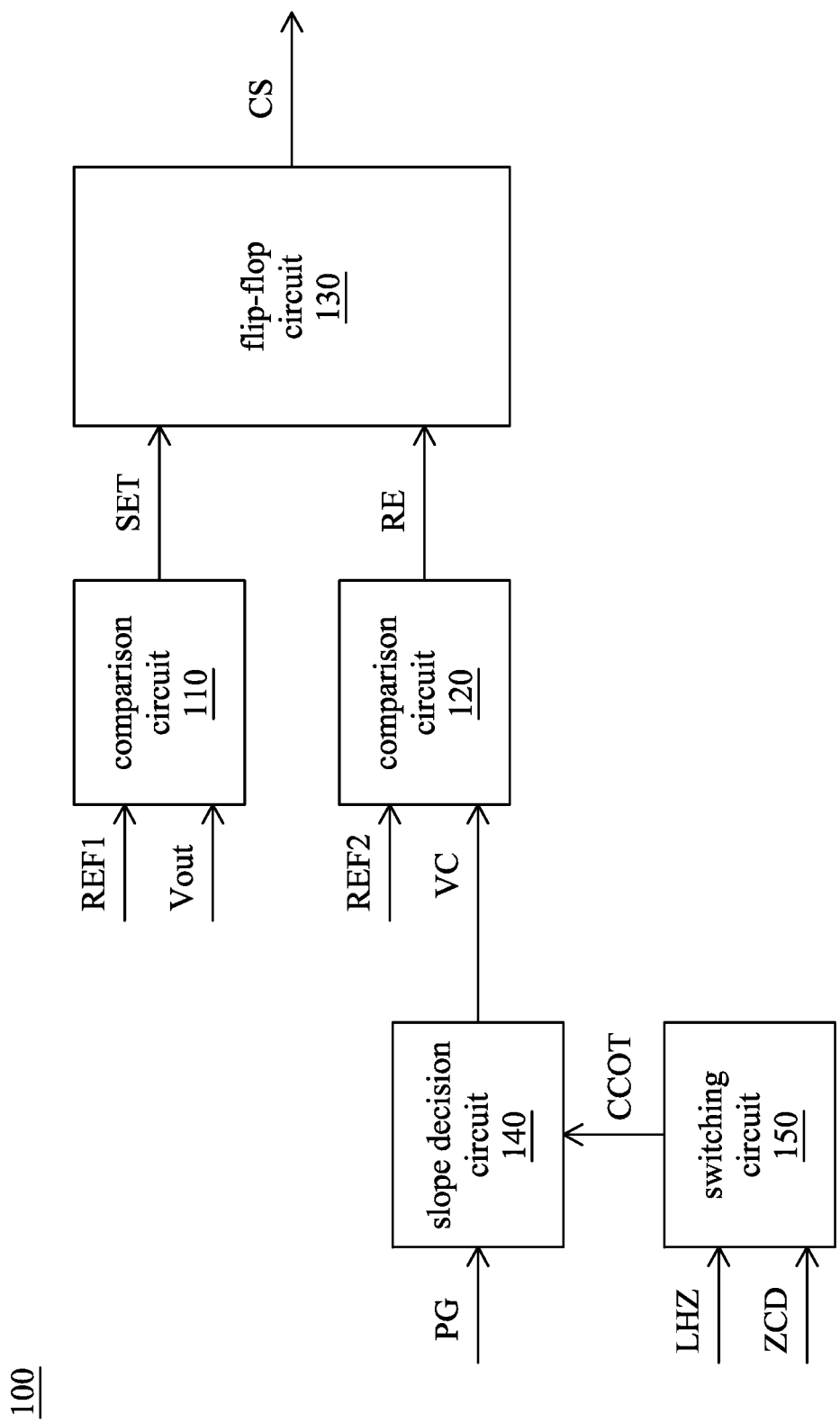
FIG. 2 is a schematic diagram illustrating a PFM control circuit in accordance with some embodiments of the disclosure.

Please refer to FIG. 2. FIG. 2 is a schematic diagram illustrating a PFM control circuit 100 in accordance with some embodiments of the disclosure. As shown in FIG. 2, the PFM control circuit 100 includes comparison circuits 110 and 120, a flip-flop circuit 130, a slope decision circuit 140, and a switching circuit 150. The slope decision circuit 140 is connected to the switching circuit 150 and the comparison circuit 120. The comparison circuits 110 and 120 are connected to the flip-flop circuit 130.

Operationally, the comparison circuit 110 outputs a first signal SET according to a reference signal REF1 and the output voltage Vout. The comparison circuit 120 outputs a second signal RE according to a reference signal REF2 and a slope modulation voltage VC. The flip-flop circuit 130 outputs the control signal CS according to the first signal SET and the second signal RE. The slope decision circuit 140 outputs the slope modulation voltage VC according to the delay signal PG and determines the slope of the slope modulation voltage VC according to a switching signal CCOT. The switching circuit 150 outputs the switching signal according to a low frequency signal LHZ and a detection signal ZCD.

Figure 3:
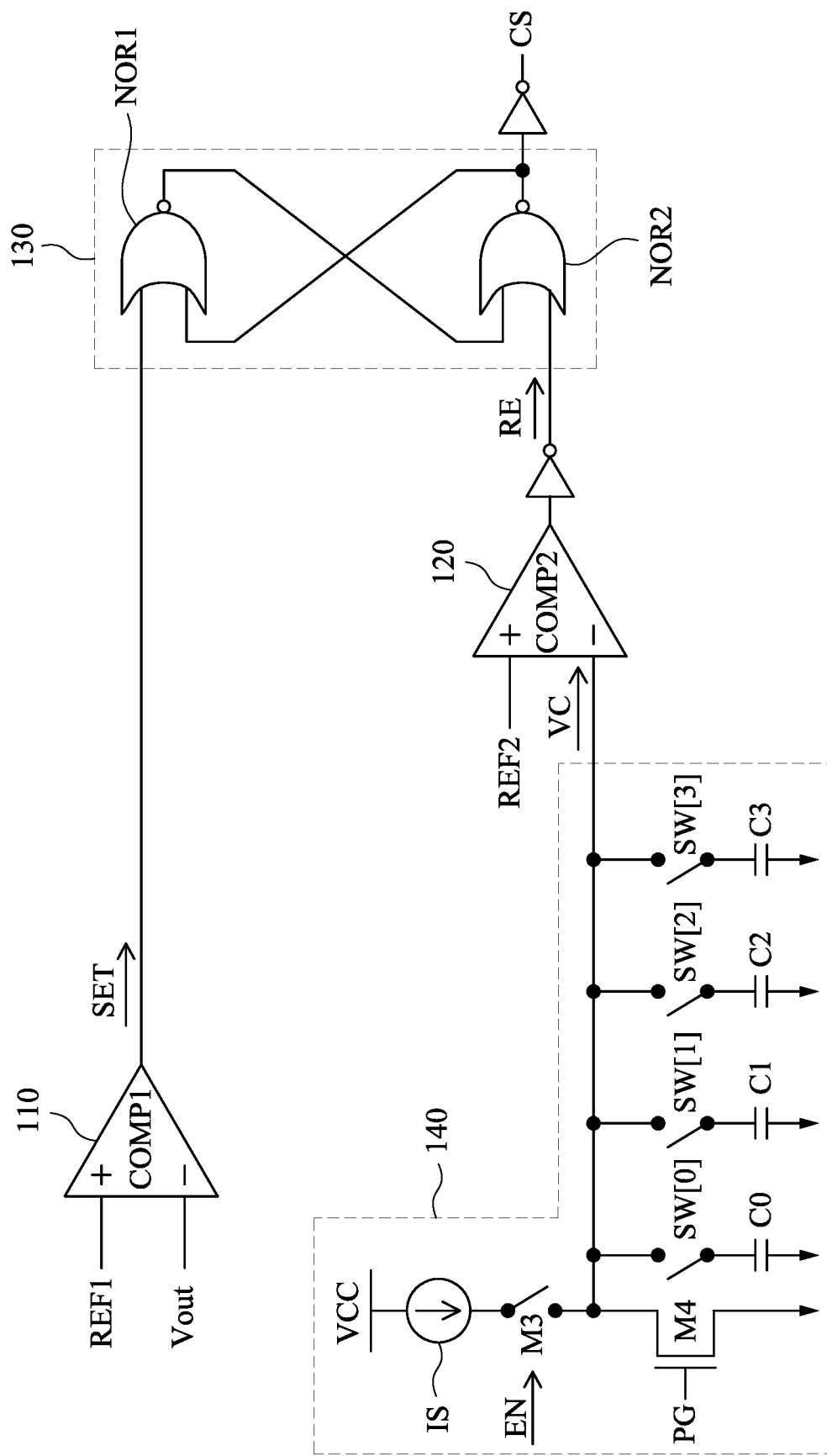
FIG. 3 is a schematic diagram illustrating part of the specific circuit in accordance with embodiments in FIG. 2 of the disclosure.
Figure 4:
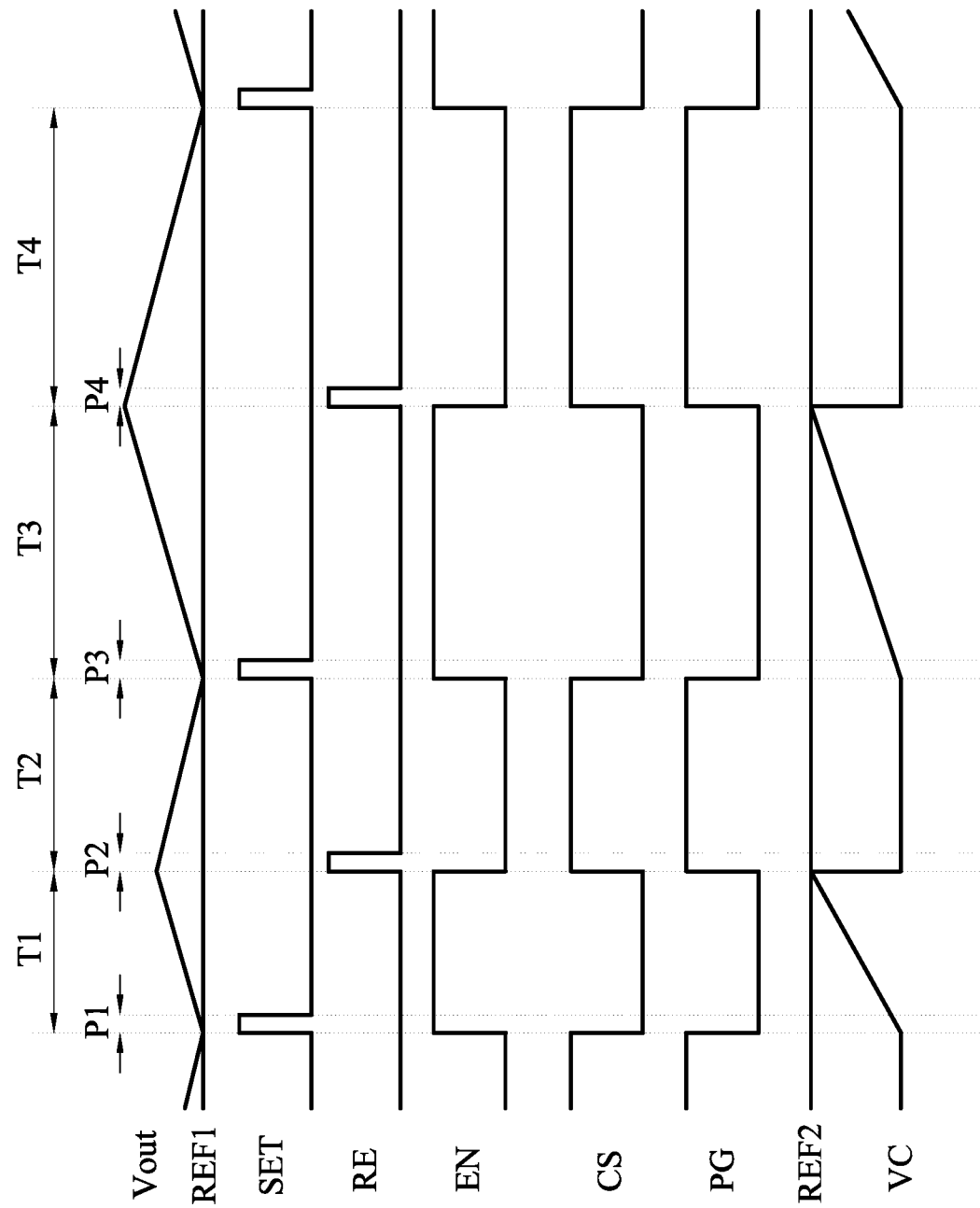
FIG. 4 is a schematic diagram illustrating signal waveform in accordance with embodiments in FIG. 3 of the disclosure.

Please refer to FIG. 3 and FIG. 4 together. FIG. 3 is a schematic diagram illustrating part of the specific circuit in accordance with embodiments in FIG. 2 of the disclosure. FIG. 4 is a schematic diagram illustrating signal waveform in accordance with embodiments in FIG. 3 of the disclosure. As shown in FIG. 3, the comparison circuits 110 and 120 may be realized by comparators COMP1 and COMP2 respectively. The flip-flop circuit 130 may be realized by a RS flip-flop composed of two NOR gates NOR1 and NOR2.

Specifically, two input terminals of the comparator COMP1 receive the reference signal REF1 and the output voltage Vout respectively. An output terminal of the comparator COMP1 is connected to a first input terminal of the RS flip-flop. For example, as a period P1 shown in FIG. 4, when the output voltage Vout is smaller than or equal to the reference signal REF1, the comparator COMP1 outputs the first signal SET with the high level to the NOR gate NOR1.

Two input terminals of the comparator COMP2 receive the reference signal REF2 and the slope modulation voltage VC. An output terminal of the comparator COMP2 is connected to a second input terminal of the RS flip-flop through the NOT gate. For example, as a period P2 shown in FIG. 4, when the slope modulation voltage VC is larger than or equal to the reference signal REF2, the comparator COMP2 outputs the second signal RE with the high level to the NOR gate NOR2 through the NOT gate.

Based on the logic operation of the RS flip-flop, when the first signal SET is at the high level and the second signal RE is at the low level, the output terminal of the NOR gate NOR2 will output the control signal CS (as the period T1 shown in FIG. 4) with the low level through the NOT gate. And when the second signal RE is at the high level, the output terminal of the NOR gate NOR2 will output the control signal CS (as the period T2 shown in FIG. 4) with the high level through the NOT gate.

In addition, in some embodiments, as shown in FIG. 3, the slope decision circuit 140 includes a current source IS, switches M3, M4 and SW[0]~SW[3], and capacitances C0~C3. Specifically, the current source IS is connected between the system high voltage VCC and a first terminal of the switch M3. A second terminal of the switch M3 and a first terminal of the switch M4 are connected to an output terminal of the slope decision circuit 140. A second terminal of the switch M4 is connected to the ground. First terminals of the switches SW[0]~SW[3] are connected to the output terminal of the slope decision circuit 140. Second terminals of the switches SW[0]~SW[3] are connected to first terminals of the capacitances C0~C3 respectively. Second terminals of the capacitances C0~C3 are connected to the ground.

Operationally, the switch M3 selectively turns on according to an enable signal EN so that the system high voltage VCC and the current source IS are provided to the output terminal of the slope decision circuit 140. The switch M4 selectively turns on according to the delay signal PG so that the output terminal of the slope decision circuit 140 is connected to the ground. For example, as the period T1 shown in FIG. 4, when the enable signal EN is at the high level and the delay signal PG is at the low level, the switch M3 turns on and the switch M4 turns off, so that the slope modulation voltage VC of the output terminal of the slope decision circuit 140 increases. And as the period T2 shown in FIG. 4, when the enable signal EN is at the low level and the delay signal PG is at the high level, the switch M3 turns off and the switch M4 turns on, so that the slope modulation voltage VC of the output terminal of the slope decision circuit 140 becomes to the ground voltage level.

In addition, the switches SW[0]~SW[3] are determined to turn on or off according to the switching signal CCOT, so as to connect the output terminal of the slope decision circuit 140 to one or more in the capacitances C0~C3, so that the equivalent capacitance value will be the minimum capacitance value or a default capacitance value. For example, in some embodiments, capacitances C0~C3 have different capacitance values, in which the capacitance value of the capacitance C0 is the smallest. When the switching signal CCOT is at the low level, merely the switch SW[0] turns on, so that the equivalent capacitance value connected to the output terminal of the slope decision circuit 140 is the minimum capacitance value; therefore, the rising slope of the slope modulation voltage VC is the largest, as the period T1 shown in FIG. 4. When the switching signal CCOT is at the high level, one of the switches SW[1]·SW[3] turns on, so that the equivalent capacitance value connected to the output terminal of the slope decision circuit 140 becomes larger; therefore, the rising slope of the slope modulation voltage VC becomes smaller, as a period T3 shown in FIG. 4.

In this way, by adjusting the equivalent capacitance value of the connected capacitance and affecting the slope of the slope modulation voltage VC based on the levels of the switching signal CCOT, the frequency of the control signal CS generated by the comparison circuits 110 and 120 and the flip-flop circuit 130 is able to be controlled. When the equivalent capacitance value is smaller, the rising slope of the slope modulation voltage VC is larger, and the frequency of the control signal CS becomes higher, as the periods T1 and T2 shown in FIG. 4. On the contrary, when the equivalent capacitance value is larger, the rising slope of the slope modulation voltage VC is smaller, and the frequency of the control signal CS becomes lower, as the periods T3 and T4 shown in FIG. 4.

It should be noted that the switches SW[0]~SW[3] and the capacitances C0~C3 illustrated in FIG. 3 are merely example, and not intended to limit the present disclosure. About the number of the capacitances, the values of the capacitances and the levels included in the slope decision circuit 140 may be adjusted and designed based on actual requirements. For example, in some other embodiments, the capacitance values of the capacitances C0~C3 may be the same, and the different levels may be set to connect different number of the capacitances. For another example, there may be more than two levels which are set according to the switching signal CCOT.

Figure 5:
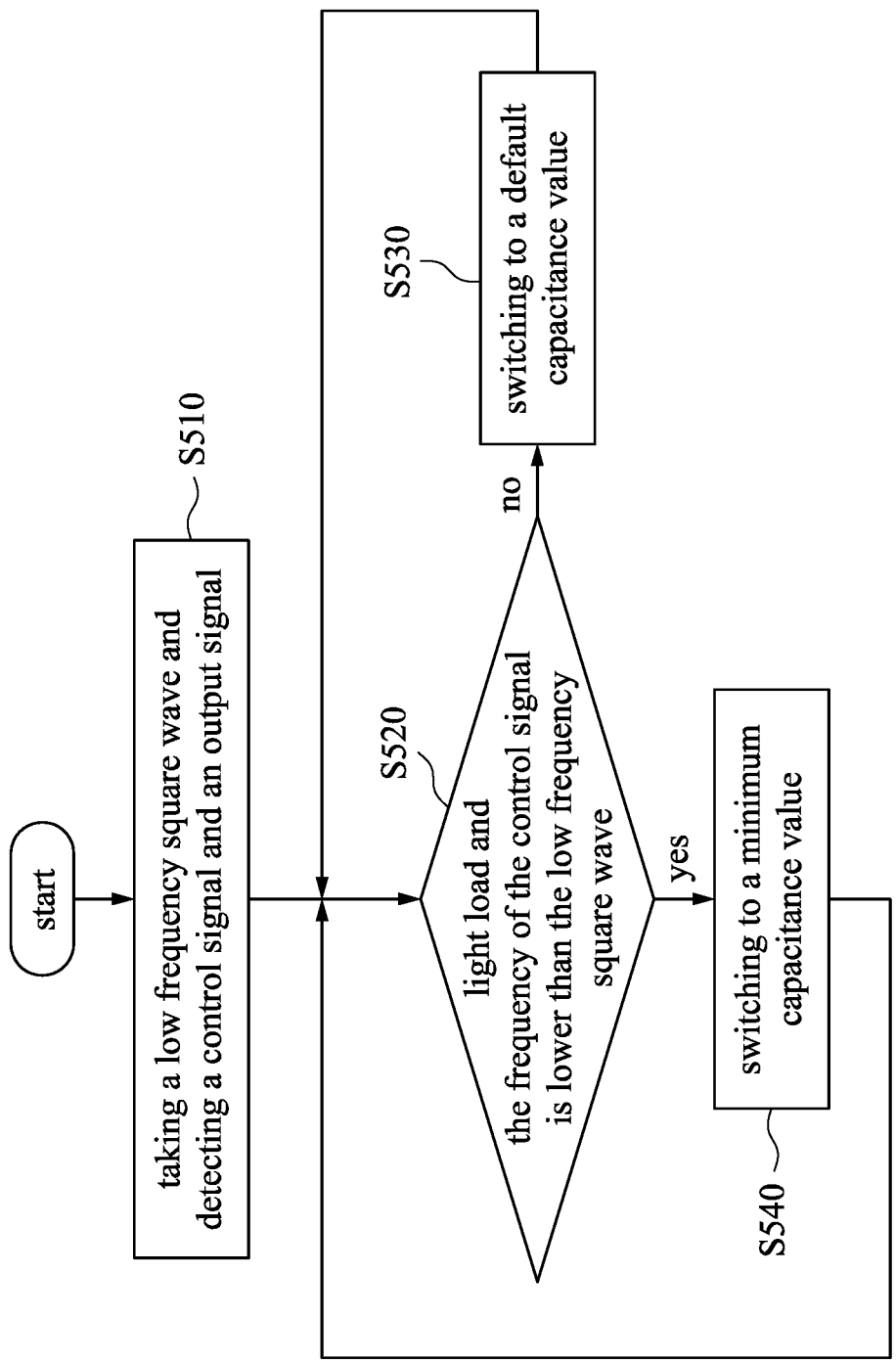
FIG. 5 is a flow chart illustrating a PFM control method in accordance with some embodiments of the disclosure.

Please refer to FIG. 5. FIG. 5 is a flow chart illustrating a PFM control method 500 in accordance with some embodiments of the disclosure. As shown in FIG. 5, the PFM control method 500 includes operations S510~S540.

Firstly, in operation S510, taking the low frequency square signal, and detecting the control signal CS and the output signals Iout and Vout.

Next, in operation S520, determining whether the load is at a light loading and whether the control signal CS is lower than the low frequency signal LHZ. The lowest audible frequency of the human ear is about 20 KHz; therefore, the low frequency signal LHZ may be set to a 32 KHz square signal (as shown in FIG. 7) higher than this frequency, but not limited to this.

When the load is not at the light loading or the control signal CS is not lower than the low frequency signal LHZ, the operation S530 is executed. In operation S530, switching to the default capacitance value according to the switching signal CCOT. In this way, when the control signal CS is at a frequency which is high enough or the load is at a heavy loading, the default capacitance value is able to be switched back so as to ensure that the power to the load is sufficient.

When the load is at the light loading and the control signal CS is lower than the low frequency signal LHZ, the operation S540 is executed. In operation S540, switching to a minimum capacitance value according to switching signal CCOT. In this way, when the power to the load is sufficient, by switching to the minimum capacitance value, the frequency of the output signal is able to increase, so as to avoid the noise spurs affecting audio quality as the output signals enter the audio device.

Figure 6:
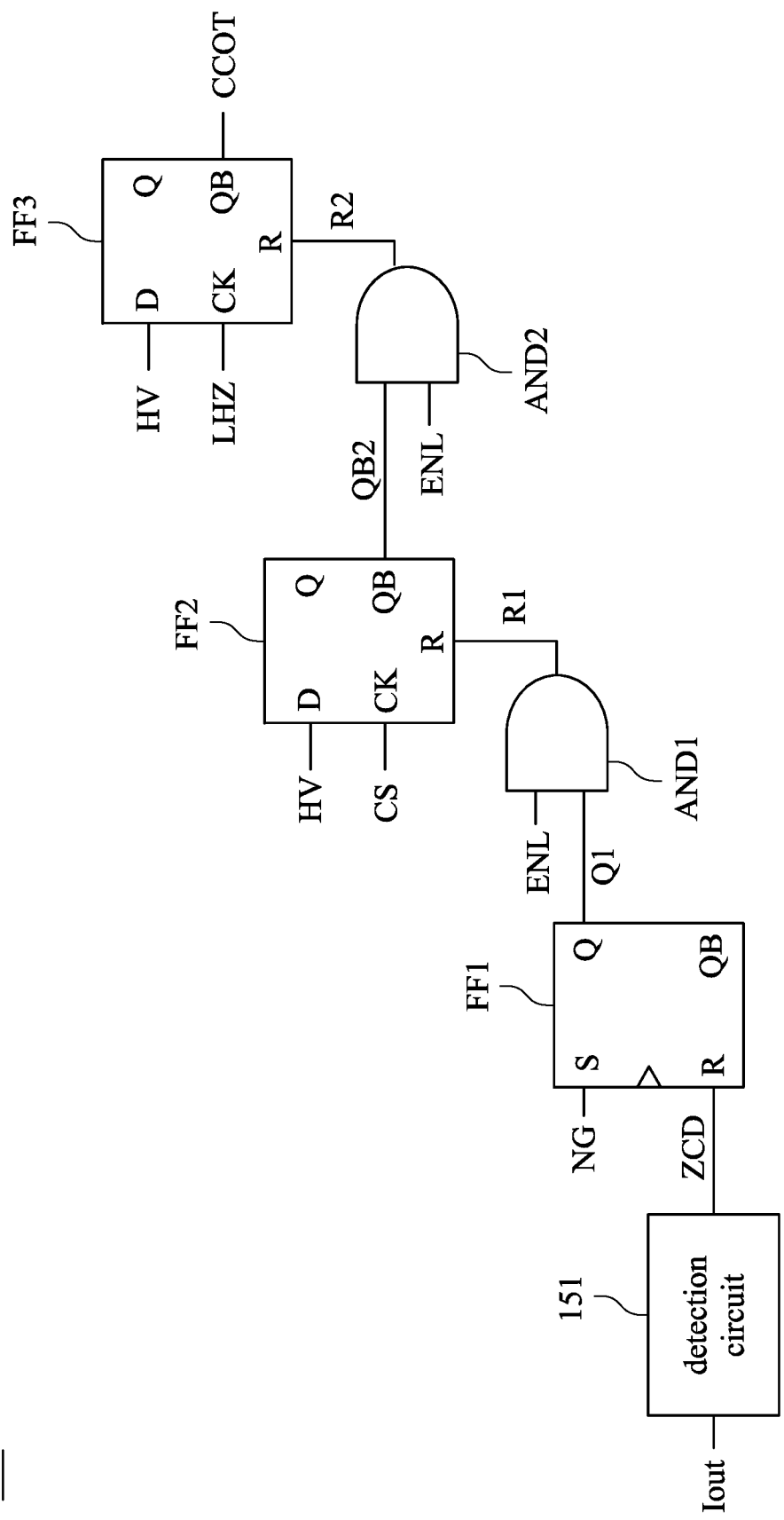
FIG. 6 is a schematic diagram illustrating another part of the specific circuit in accordance with embodiments in FIG. 2 of the disclosure.
Figure 7:
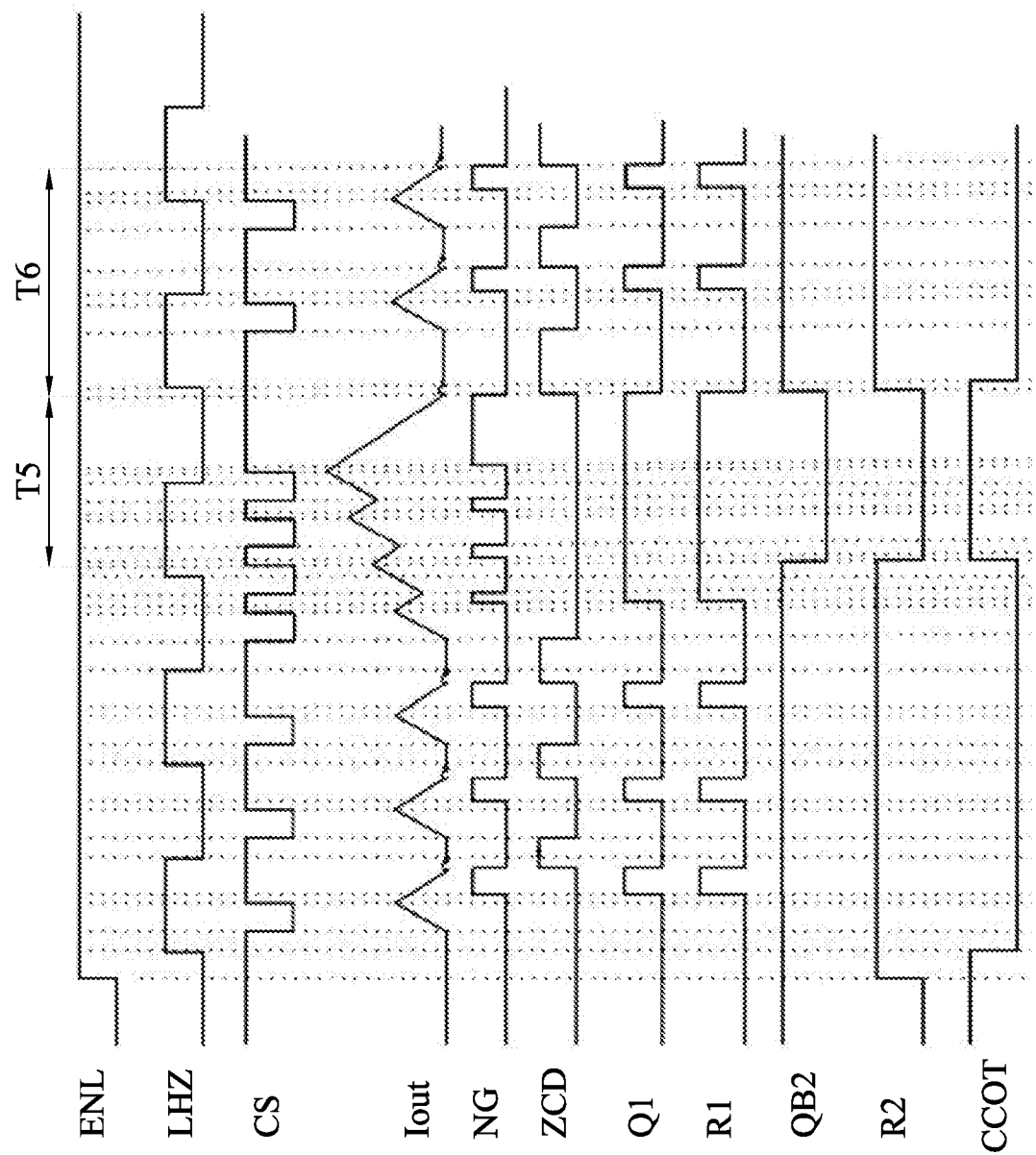
FIG. 7 is a schematic diagram illustrating signal waveforms in accordance with embodiments in FIG. 6 of the disclosure.

Please refer to FIG. 6 and FIG. 7. FIG. 6 is a schematic diagram illustrating another part of the specific circuit in accordance with embodiments in FIG. 2 of the disclosure. FIG. 7 is a schematic diagram illustrating signal waveforms in accordance with embodiments in FIG. 6 of the disclosure. As shown in FIG. 6, the switching circuit 150 includes a detection circuit 151, flip-flops FF1~FF3 and AND gates AND1 and AND2.

Specifically, the detection circuit 151 receives output current Iout, and outputs the detection signal ZCD with the high level according to the output current Iout close to zero, and outputs the detection signal ZCD with the low level according to the output current Iout larger than zero.

The flip-flop FF1 is a RS flip-flop. An 'S' input terminal of the flip-flop FF1 receives the delay signal NG. An 'R' input terminal of the flip-flop FF1 is connected to the detection circuit 151 to receive the detection signal ZCD. Based on the logic operation of the RS flip-flop, when the delay signal NG is at the high level, a determined signal Q1 with high level is outputted by a 'Q' output terminal of the flip-flop FF1. When the detection signal ZCD is at the high level, the determined signal Q1 with the low level is outputted by the 'Q' output terminal of the flip-flop FF1. And when the delay signal NG and the detection signal ZCD are both at the low level, the determined signal Q1 maintains the original level.

The AND gate AND1 receives a low frequency enable signal ENL, and is connected to the 'Q' output terminal of the flip-flop FF1 to receive the determined signal Q1. When the low frequency enable signal ENL turns to the high level, the level of the determined signal R1 outputted by the AND gate AND1 changes with the determined signal Q1.

The flip-flop FF2 is a D flip-flop. A 'D' input terminal of the flip-flop FF2 receives a high reference voltage HV (or the system high voltage VCC). A 'CK' clock input terminal of the flip-flop FF2 receives control signal CS. A reset input terminal of the flip-flop FF2 is connected to the AND gate AND1 to receive the determined signal R1. Based on the logic operation of the D flip-flop, when the determined signal R1 is at the low level, a determined signal QB2 with the high level is outputted by a 'QB' output terminal of the flip-flop FF2. When the determined signal R1 is at the high level, the determined signal QB2 with the low level is outputted by the 'QB' output terminal of the flip-flop FF2 while the control signal CS turning to the high level.

The AND gate AND2 receives the low frequency enable signal ENL, and is connected to the flip-flop FF2 to receive the determined signal QB2. When the low frequency enable signal ENL turns to the high level, the level of a determined signal R2 outputted by the AND gate AND2 changes with the determined signal QB2.

The flip-flop FF3 is a D flip-flop. A 'D' input terminal of the flip-flop FF3 receives the high reference voltage HV (or the system high voltage VCC). A 'CK' clock input terminal of the flip-flop FF3 receives the low frequency signal LHZ. A reset input terminal of the flip-flop FF3 is connected to the AND gate AND2 to receive the determined signal R2. Based on the logic operation of the D flip-flop, when the determined signal R2 is at the low level, the switching signal CCOT with high level is outputted by a 'QB' output terminal of the flip-flop FF3. When the determined signal R2 is at the high level, the switching signal COOT with low level is outputted by the 'QB' output terminal of the flip-flop FF3 while the low frequency signal LHZ turning to the high level.

In this way, as a period T5 shown in FIG. 7, when the output current Iout is not enough (i.e., the load becomes heavy) so that the detection signal ZCD maintains at the low level, and when the control signal CS turns from the low level to the high level, the switching signal CCOT turns to the high level so as to switch to the default capacitance value to ensure that the power conversion circuit 200 can provide enough power to the load. In addition, as a period T6 shown in FIG. 7, when the output current Iout is close to zero again so that the detection signal ZCD turns to the high level, and when the low frequency signal LHZ turns from the low level to the high level, the switching signal CCOT turns from the low level so as to switch to the minimum capacitance value to increase the working frequency of the power conversion circuit 200, so that the working frequency avoids falling into the low frequency.

In summary, by adjusting the level of the control signal CS according to the feedback of PFM control circuit 100 base on the control signal CS, the delay signals PG and NG, the output current Iout and output voltage Vout, the power conversion circuit 200 can be controlled to charge and discharge the load, so as to generate the output signal. By controlling the equivalent capacitance value of the connected capacitance based on the levels of the switching signal CCOT, the rising slope of the slope modulation voltage VC can be controlled, thereby controlling the frequency of the control signal CS.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A PFM control circuit, comprising:
   a first comparison circuit, configured to output a first signal according to an output voltage of a power conversion circuit;
   a switching circuit, configured to output a switching signal according to an output current of the power conversion circuit;
   a slope decision circuit, configured to output a slope modulation voltage, and to decide the slope modulation voltage with a first slope or a second slope according to the switching signal;
   a second comparison circuit, configured to output a second signal according to the slope modulation voltage; and
   a flip-flop circuit, configured to output a control signal to the power conversion circuit according to the first signal and the second signal,
   wherein when the slope modulation voltage has the first slope, the control signal has a first frequency, when the slope modulation voltage has the second slope, the control signal has a second frequency, wherein the first frequency is higher than the second frequency.

2. The PFM control circuit of claim 1, wherein the first comparison circuit is configured to output the first signal when the output voltage is smaller than or equal to a first reference signal, the second comparison circuit is configured to output the second signal when the slope modulation voltage is larger than or equal to a second reference signal.

3. The PFM control circuit of claim 2, wherein the flip-flop circuit outputs the control signal with a first level when the flip-flop circuit receives the first signal, the flip-flop circuit outputs the control signal with a second level when the flip-flop circuit receives the second signal.

4. The PFM control circuit of claim 3, wherein the slope decision circuit comprises:
   a current source;
   an output terminal, configured to output the slope modulation voltage;
   a ground terminal;
   a first switch, electrically connected between the current source and the output terminal;
   a second switch, electrically connected between the output terminal and the ground terminal; and
   a capacitance array, electrically connected to the output terminal through a switch array, wherein when the first switch turns on and the second switch turns off, the current source charges to the capacitance array so that the slope modulation voltage increases, wherein when the first switch turns off and the second switch turns, the capacitance array discharges so that the slope modulation voltage becomes a ground voltage level of the ground terminal.

5. The PFM control circuit of claim 4, wherein when the switching signal is at a low level, a corresponding one in the switch array turns on, so that one with a first capacitance value in the capacitance array is electrically connected to the output terminal, when the switching signal is at a high level, a default one in the switch array turns on, so that one with a second capacitance value in the capacitance array is electrically connected to the output terminal, wherein the second capacitance value is larger than the first capacitance value.

6. The PFM control circuit of claim 3, wherein the switching circuit comprises:
   a detection circuit, configured to generate a detection signal according to the output current;
   a first flip-flop, configured to receive the detection signal and a delay signal of the output voltage, and to generate a first determined signal according to the detection signal and the delay signal;
   a second flip-flop, configured to receive the first determined signal and the control signal, and to generate a second determined signal according to the first determined signal and the control signal; and
   a third flip-flop, configured to receive the second determined signal and a low frequency signal, and to generate the switching signal according to the second determined signal and the low frequency signal.

7. The PFM control circuit of claim 6, wherein the first flip-flop is configured to output the first determined signal with a high level when a voltage level of the delay signal increases, and to output the first determined signal with a low level when a voltage level of the detection signal increases, the second flip-flop is configured to output the second determined signal with the high level when the first determined signal is at the low level, and to output the second determined signal with the low level when the first determined signal is at the high level and a voltage level of the control signal increases, the third flip-flop is configured to output the switching signal with the high level when the second determined signal is at the low level, and to output the switching signal with the low level when the second determined signal is at the high level and the low frequency signal increases.

8. A PFM control system, comprising:
a power conversion circuit, configured to generate an output signal according to a control signal to charge and to discharge to a load; and
a PFM control circuit, comprising:
   a first comparison circuit, configured to output a first signal of an output voltage according to the output signal;
   a switching circuit, configured to output a switching signal according to an output current of the output signal;
   a slope decision circuit, configured to output a slope modulation voltage, and to decide the slope modulation voltage with a first slope or a second slope according to the switching signal;
   a second comparison circuit, configured to output a second signal according to the slope modulation voltage; and
   a flip-flop circuit, configured to output the control signal to the power conversion circuit according to the first signal and the second signal.

9. The PFM control system of claim 8, wherein the power conversion circuit is configured to charge to the load when receiving the control signal with a first level, the power conversion circuit is configured to discharge to the load when receiving the control signal with a second level.

10. The PFM control system of claim 8, wherein the first comparison circuit is configured to output the first signal when the output voltage is smaller than or equal to a first reference voltage, the second comparison circuit is configured to output the second signal when the slope modulation voltage is larger than or equal to a second reference voltage.

11. The PFM control system of claim 8, wherein the flip-flop circuit outputs the control signal with a first level when the flip-flop circuit receives the first signal, the flip-flop circuit outputs the control signal with a second level when the flip-flop circuit receives the second signal.

12. The PFM control system of claim 8, wherein the slope decision circuit comprises a first capacitance and a second capacitance, capacitance value of the first capacitance is smaller than capacitance value of the second capacitance, the slope decision circuit is configured to selectively charge the first capacitance or the second capacitance according to the switching signal, so as to correspondingly generate the slope modulation voltage with the first slope or the second slope.

13. The PFM control system of claim 8, wherein the switching circuit comprises:
   a first flip-flop, configured to generate a first determined signal according to the output voltage and the output current;
   a second flip-flop, configured to generate a second determined signal according to the first determined signal and the control signal; and
   a third flip-flop, configured to generate the switching signal according to the second determined signal and a low frequency signal.

14. A PFM control method, comprising:
outputting, by a PFM control circuit, a control signal;
charging and discharging, by a power conversion circuit, to a load according to the control signal, so as to generate an output signal;
determining whether the load connected to the power conversion circuit is at a light loading according to the output signal, and determining whether a frequency of the control signal is lower than a frequency of a low frequency signal;
switching a capacitance array of the PFM control circuit into a first capacitance value when the load is at the light loading and the frequency of the control signal is lower than the frequency of the low frequency signal, so as to generate the control signal with a first frequency; and
switching the capacitance array of the PFM control circuit into a second capacitance value when the load is not at the light loading or the frequency of the control signal is not lower than the frequency of the low frequency signal, so as to generate the control signal with a second frequency, wherein the first capacitance value is smaller than the second capacitance value, the first frequency is higher than the second frequency.

15. The PFM control method of claim 14, wherein charging and discharging, by the power conversion circuit, to a load according to the control signal comprises:
   charging to the load when the power conversion circuit receives the control signal with a first level, so that a voltage and a current of the output signal increase; and
   discharging to the load when the power conversion circuit receives the control signal with a second level, so that the voltage and the current of the output signal reduce.

16. The PFM control method of claim 14, wherein outputting, by the PFM control circuit, the control signal comprises:
   outputting, by a first comparison circuit, a first signal when a voltage of the output signal is smaller than or equal to a first reference voltage;
   outputting, by a slope decision circuit, a slope modulation voltage according to the control signal and the first capacitance value or the second capacitance value of the capacitance array;
   outputting, by a second comparison circuit, a second signal when the slope modulation voltage is larger than or equal to a second reference voltage; and
   outputting, by a flip-flop circuit, the control signal according to the first signal and the second signal.

17. The PFM control method of claim 14, further comprising:
   generating, by a buffer circuit, a delay signal according to a voltage of the output signal;
   generating, by a detection circuit, a detection signal according to a current of the output signal;
   outputting, by a first flip-flop, a first determined signal according to the delay signal and the detection signal;
   outputting, by a second flip-flop, a second determined signal according to the first determined signal and the control signal; and
   outputting, by a third flip-flop, a switching signal according to the second determined signal and the low frequency signal, so as to switch the capacitance array into the first capacitance value or the second capacitance value.

18. The PFM control method of claim 17, wherein outputting, by the first flip-flop, the first determined signal according to the delay signal and the detection signal comprises:

outputting, by the first flip-flop, the first determined signal with a high level when a voltage level of the delay signal increases; and outputting, by the first flip-flop, the first determined signal with a low level when a voltage level of the detection signal increases.

19. The PFM control method of claim 17, wherein outputting, by the second flip-flop, the second determined signal according to the first determined signal and the control signal comprises:

outputting, by the second flip-flop, the second determined signal with a high level when the first determined signal is at a low level; and outputting, by the second flip-flop, the second determined signal with a low level when the first determined signal is at the high level.

20. The PFM control method of claim 17, wherein outputting, by the third flip-flop, the switching signal according to the second determined signal and the low frequency signal comprises:

outputting, by the third flip-flop, the switching signal with a high level when the second determined signal is at a low level, so as to switch the capacitance array into the second capacitance value; and outputting, by the third flip-flop, the switching signal with a low level while the low frequency signal rising when the second determined signal is at the high level, so as to switch the capacitance array into the first capacitance value.

\* \* \* \* \*